United States Patent
Ko et al.

(10) Patent No.: US 7,582,934 B2
(45) Date of Patent: *Sep. 1, 2009

(54) ISOLATION SPACER FOR THIN SOI DEVICES

(75) Inventors: Chih-Hsin Ko, Fongshan (TW);
Wen-Chin Lee, Hsin-Chu (TW);
Yee-Chia Yeo, Kaosiung (TW);
Chung-Hu Ke, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/040,877

(22) Filed: Mar. 1, 2008

(65) Prior Publication Data

US 2008/0142888 A1 Jun. 19, 2008

Related U.S. Application Data

(63) Continuation of application No. 10/969,374, filed on Oct. 20, 2004, now Pat. No. 7,358,571.

(51) Int. Cl.
*H01L 27/12* (2006.01)

(52) U.S. Cl. ............... 257/349; 257/347; 257/401; 257/616; 257/900; 257/E27.112

(58) Field of Classification Search ............... 257/288, 257/289, 347, 348, 349, 401, 410, 411, 412, 257/413, 616, 900, E27.112
See application file for complete search history.

(56) References Cited

U.S. PATENT DOCUMENTS

| | | | |
|---|---|---|---|
| 5,482,871 A | 1/1996 | Pollack | |
| 6,509,583 B1 | 1/2003 | Iwamatsu et al. | |
| 6,555,879 B1 | 4/2003 | Krivokapic et al. | |
| 6,566,198 B2 | 5/2003 | Park et al. | |
| 6,596,615 B2 | 7/2003 | Ipposhi et al. | |
| 6,642,115 B1 | 11/2003 | Cohen et al. | |
| 6,653,656 B2 | 11/2003 | Iwamatsu et al. | |
| 6,774,390 B2 | 8/2004 | Sugiyama et al. | |
| 6,838,733 B2 | 1/2005 | Takehiro | |
| 6,967,377 B2 | 11/2005 | Cohen et al. | |
| 7,091,071 B2 | 8/2006 | Thean et al. | |
| 7,358,571 B2 * | 4/2008 | Ko et al. | 257/349 |
| 2004/0188760 A1 | 9/2004 | Skotnicki et al. | |

OTHER PUBLICATIONS

Choi, Yang-Ku et al., 30nm Ultra-Thin-Body SOI MOSFET with Selectivity Deposited Ge Raised S/D, Device Research Conference, Jun. 2000, pp. 23-24, Denver, CO.
Leland, Chang et al., Moore's Law Lives On, IEEE Circuits & Devices Magazine, Jan. 2003, pp. 35-42.
Jaeger, Richard C., Introduction to Microelectronic Fabrication, Prentice Hall, 2002, vol. 5, 1 and 163.

* cited by examiner

*Primary Examiner*—A. Sefer
*Assistant Examiner*—Eduardo A Rodela
(74) *Attorney, Agent, or Firm*—Haynes and Boone, LLP

(57) ABSTRACT

A semiconductor device comprises a semiconductor mesa overlying a dielectric layer, a gate stack formed overlying the semiconductor mesa, and an isolation spacer formed surrounding the semiconductor mesa and filling any undercut region at edges of the semiconductor mesa.

13 Claims, 13 Drawing Sheets

ISOLATION SPACER FOR THIN SOI DEVICES

CROSS-REFERENCE

This application is a Continuation of U.S. patent application Ser. No. 10/969,374, filed Oct. 20, 2004, the disclosure of which is incorporated herein by reference.

The present application is related to U.S. Divisional patent application Ser. No. 12/036,616, filed Feb. 25, 2008, which claims priority to U.S. patent application Ser. No. 10/969,374, filed Oct. 20, 2004, the disclosure of which is incorporated herein by reference.

BACKGROUND

When a thin semiconductor-on-insulator (SOI) device is fabricated in semiconductor microelectronics, undercuts may be formed in the buried dielectric layer during etching and/or cleaning processing while patterning the gate stack. Thereafter during silicidation, silicide residues may be formed in the undercut regions and result in leakage paths between adjacent channel regions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2 to 7a and 7b are sectional views of exemplary embodiments of a thin SOI device during fabrication;

FIGS. 9 to 11a and 11b are sectional views of exemplary embodiments of a thin SOI device during fabrication;

DETAILED DESCRIPTION

Figure 1:
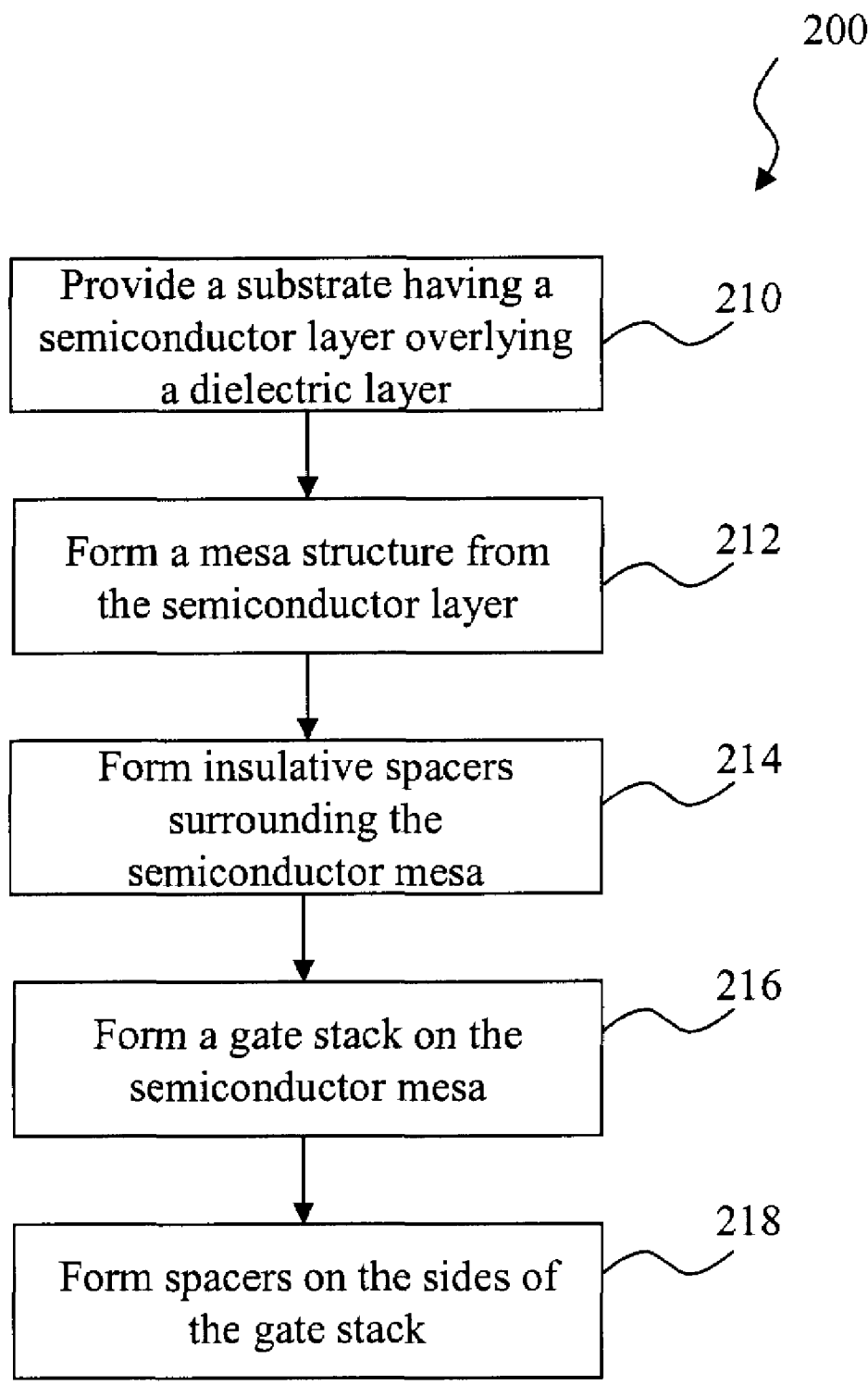
FIG. 1 is a simplified flowchart of one embodiment of a method to form a thin SOI device.

The present disclosure relates generally to a microelectronic device and, more specifically, to a microelectronic device having a thin SOI structure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a simplified flowchart of a method 200 to form a SOI device having an isolation spacer.

With additional reference to FIGS. 2 to 7 as sectional views of the semiconductor device 100 during fabrication, the semiconductor device 100 and the method 200 to make the same are provided below.

Figure 2:
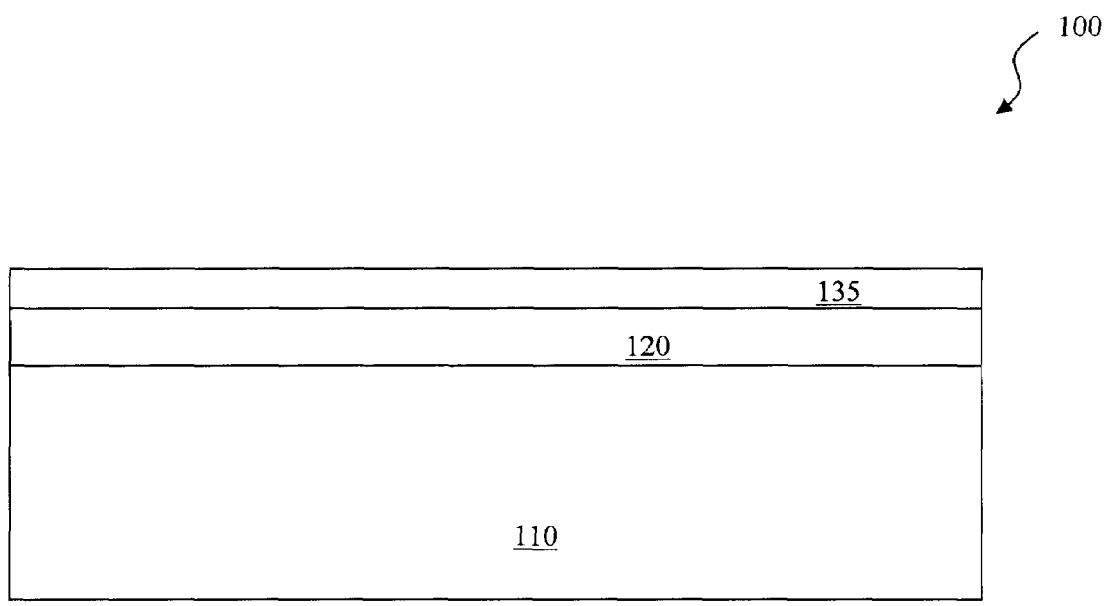

The method 200 begins at step 210 by providing a semiconductor substrate 110, a dielectric layer 120 disposed above the substrate 110, and a semiconductor layer 135 disposed above the dielectric layer 120 as shown in FIG. 2.

The semiconductor device 100 may have a SOI structure having the dielectric layer 120 interposed between the substrate 110 and the semiconductor layer 135. The substrate 110 and semiconductor layer 135 each may include silicon, gallium arsenide, gallium nitride, strained silicon, silicon germanium, silicon carbide, carbide, diamond, and/or other materials. The semiconductor substrate 110 may include an epitaxy layer. The semiconductor layer 135 may have a thickness ranging between about 5 nm and about 200 nm in one embodiment. Preferably, the thickness of the semiconductor layer 130 may be ranged between about 5 nm and about 30 nm. The dielectric layer 120 may comprise silicon oxide, silicon nitride, silicon oxynitride, and/or other dielectric materials. The dielectric layer 120 may have a thickness ranging from about 10 nm to about 100 nm, preferably ranging from about 10 nm to about 30 nm.

The dielectric layer 120 and the semiconductor layer 135 may be formed using various SOI technologies. For example, the dielectric layer 120 may be formed in the semiconductor substrate, by a process referred to as separation by implanted oxygen (SIMOX). The SIMOX technology is based on ion-implanting a high-dose of oxygen ions into a silicon wafer, such that the peak concentration lies beneath the silicon surface. After implantation these wafers are subjected to a high-temperature anneal (about 1150° C. to about 1400° C., for example) to form a continuous stoichiometric subsurface-layer of silicon-dioxide. Thus formed dielectric layer 120 (also referred to as buried oxide or BOX) electrically separates the semiconductor layer 135 and the semiconductor substrate 110.

Figure 3:
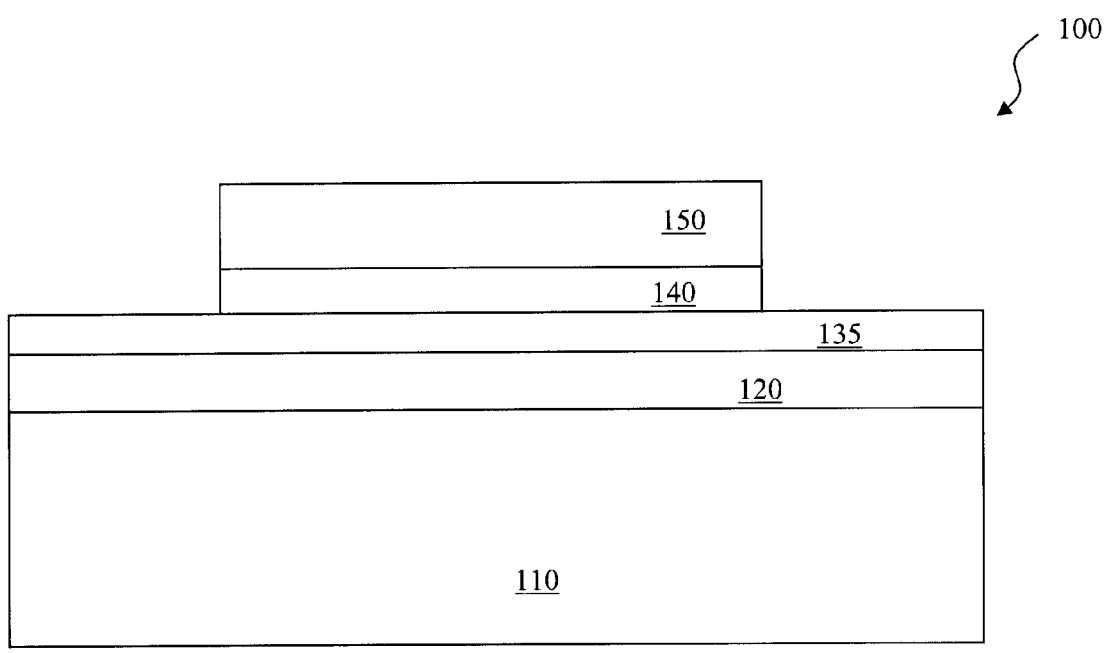
Figure 4A:
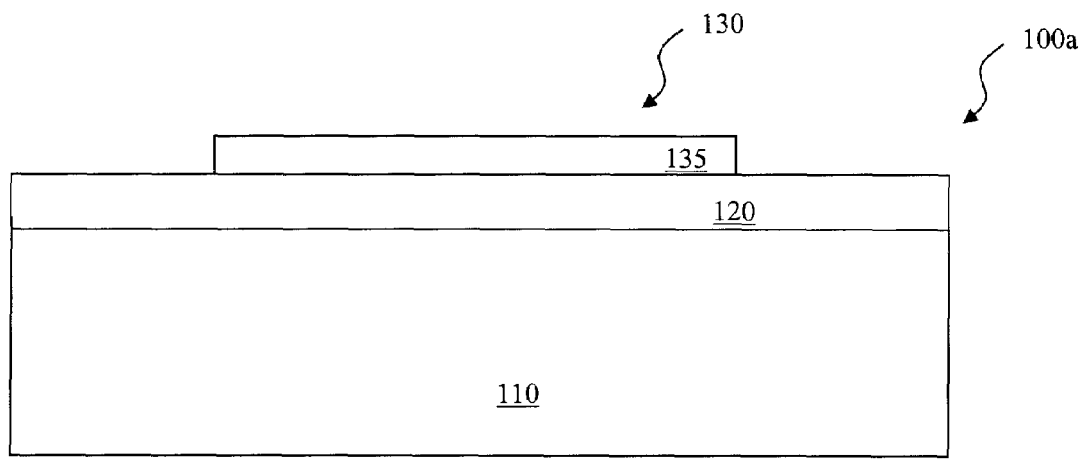
Figure 4B:
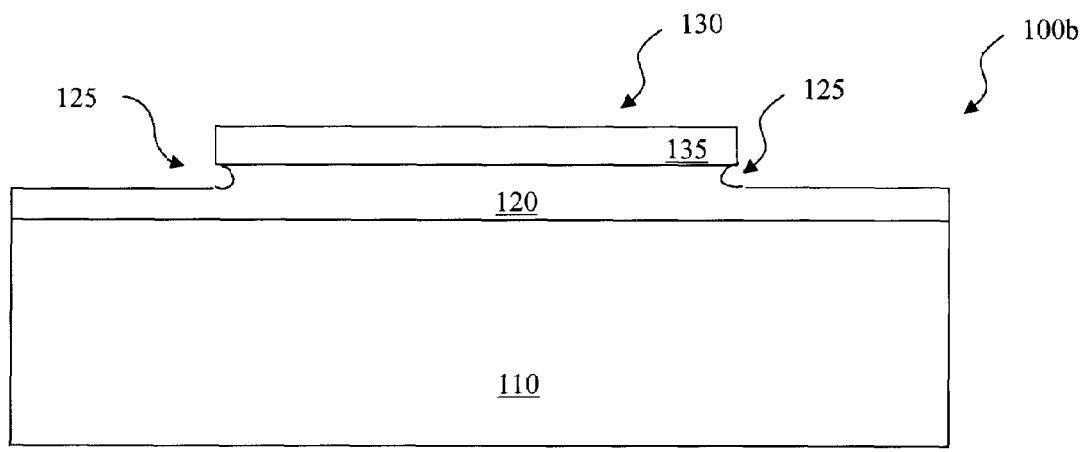

The method 200 proceeds to step 212 in which the semiconductor layer 135 is patterned to form a semiconductor mesa (or island) 130. Referring to FIG. 3, a silicon oxide layer 140 and a silicon nitride layer 150 are formed on the semiconductor layer 135 by a method such as chemical vapor deposition (CVD), thermal oxidation, atomic layer deposition (ALD), physical vapor deposition (PVD), and/or other processing techniques. Then the silicon oxide layer 140 and silicon nitride layer 150 are patterned with suitable processing including photolithography and etching. Referring to FIGS. 4a and 4b, an etching process is implemented to transfer the pattern defined by the silicon oxide layer 140 and silicon nitride layer 150 to the semiconductor layer 135 to form the semiconductor mesa 130. Then the silicon oxide layer 140 and silicon nitride layer 150 are removed by a process such as wet etching or other suitable techniques. A cleaning process may be followed after the silicon etching and/or silicon nitride/silicon oxide removal. During the etching process to pattern the semiconductor layer 135 and/or cleaning process, the buried dielectric layer 120 underlying the semiconductor layer 135 may also be partially removed and undercuts or voids 125 may be formed at the edges of the semiconductor mesa 130 as shown in FIG. 4b. FIG. 4a illustrates another embodiment wherein no undercut is formed.

Figure 5A:
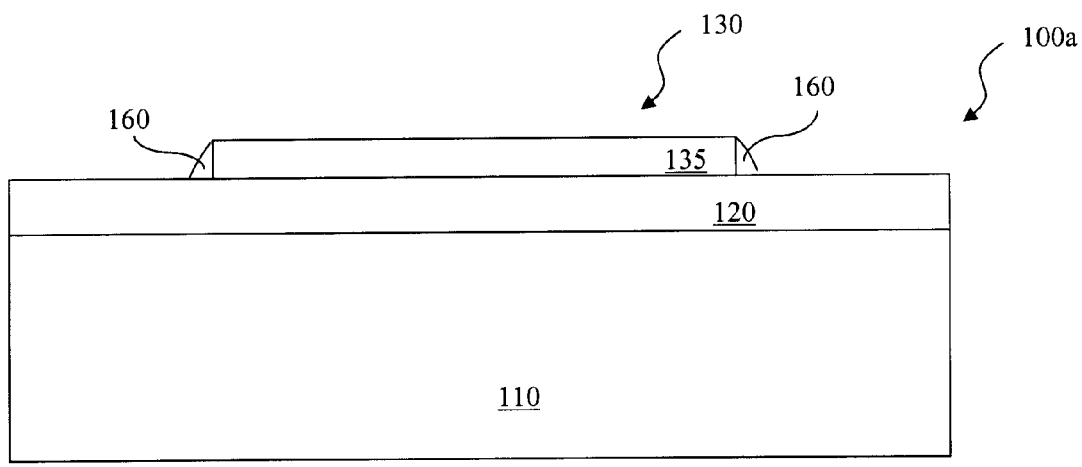
Figure 5B:
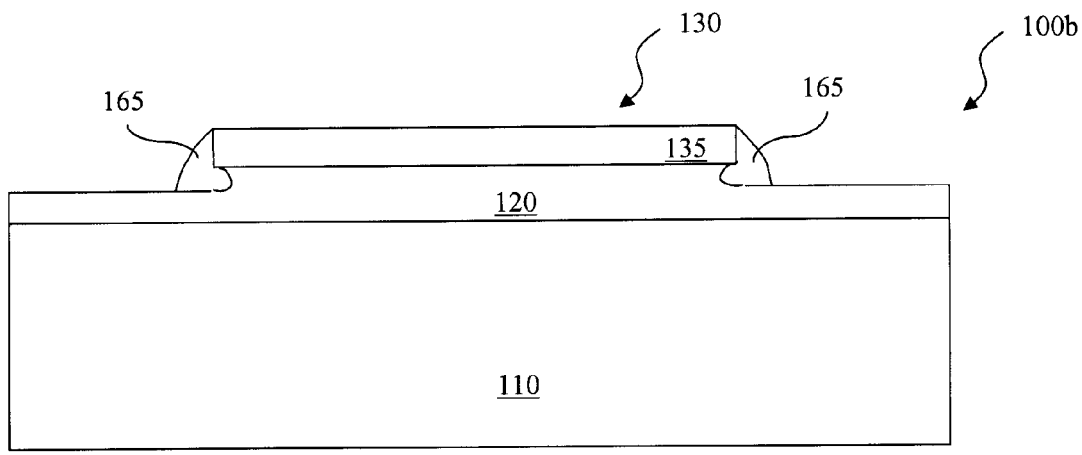

The method 200 proceeds to step 214 at which isolation spacers are formed. Referring to FIGS. 5a and 5b, isolation spacers 160 (FIG. 5a) or 165 (FIG. 5b) are formed at edges of the semiconductor mesa 130. The isolation spacers 165 fill the undercut regions at edges of the mesa 130. The isolation spacers 160 or 165 may comprise silicon oxide, silicon nitride, silicon oxynitride, other dielectric material, or combinations thereof. The isolation spacers 160 or 165 are operable to protect the edges of the semiconductor layer 130 from forming a conductive feature such as forming silicide residues during a silicidation process. Such undesirable conductive features may lead to leakage or short between adjacent channel regions.

In one embodiment, a layer of silicon oxide may be formed by CVD, thermal oxidation, PVD, or ALD. A layer of silicon nitride may be formed afterward by CVD, PVD, ALD, or other suitable process. Thus formed multi-layer dielectric material is then partially etched away to form the isolation spacers using a process which may include dry etching.

Figure 6A:
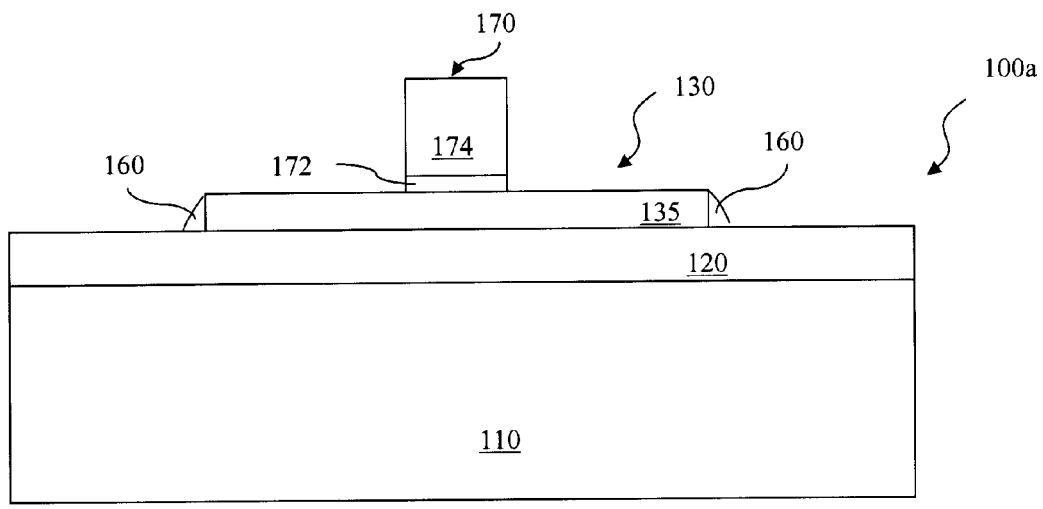
Figure 6B:
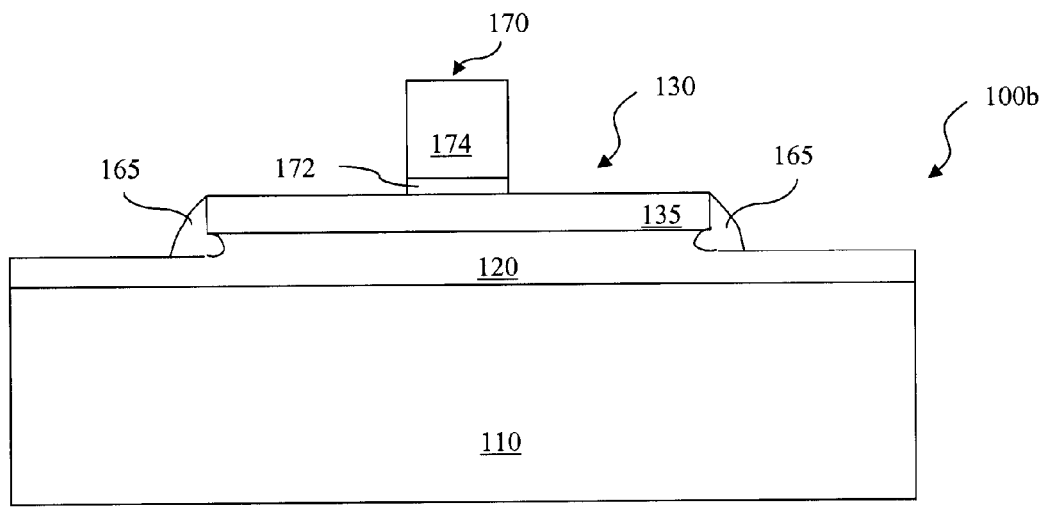

The method 200 proceeds to step 216 at which a gate stack 170 is formed on the substrate 110. The gate stack 170 may include the gate dielectric 172 and the gate electrode 174. Referring to FIGS. 6a and 6b, the gate dielectric layer 172 may include silicon oxide, silicon oxynitride, high-k material, or a combination thereof. The high-k material may include TaN, TiN, $Ta_2O_5$, $HfO_2$, $ZrO_2$, HfSiON, $HfSi_x$, $HfSi_xN_y$, $HfAlO_2$, $NiSi_x$, and/or other suitable materials. The gate dielectric layer 172 may have a thickness ranging between about 5 Angstroms and about 20 Angstroms. The gate dielectric layer may have a multilayer structure such as one layer of silicon oxide and one layer of high-k material. The gate electrode 174 may include a layer of polysilicon, metal, metal silicide, or other conductive material. The gate electrode 174 may have a multilayer structure such as one layer of poly silicon and one layer of metal silicide. The metal silicide may include one or more metals such as Ti, Ta, W, Co, Ni, Al, Cu, and/or other metals.

The gate stack 170 may be formed by forming a dielectric layer, forming a conductive layer, and then patterning the both to form the gate dielectric 172 and gate electrode 174. The dielectric layer may be formed using ALD, CVD, PVD, and/or other methods. The conductive layer may be formed by CVD, ALD, PVD, plating, and/or other processing methods.

Figure 7A:
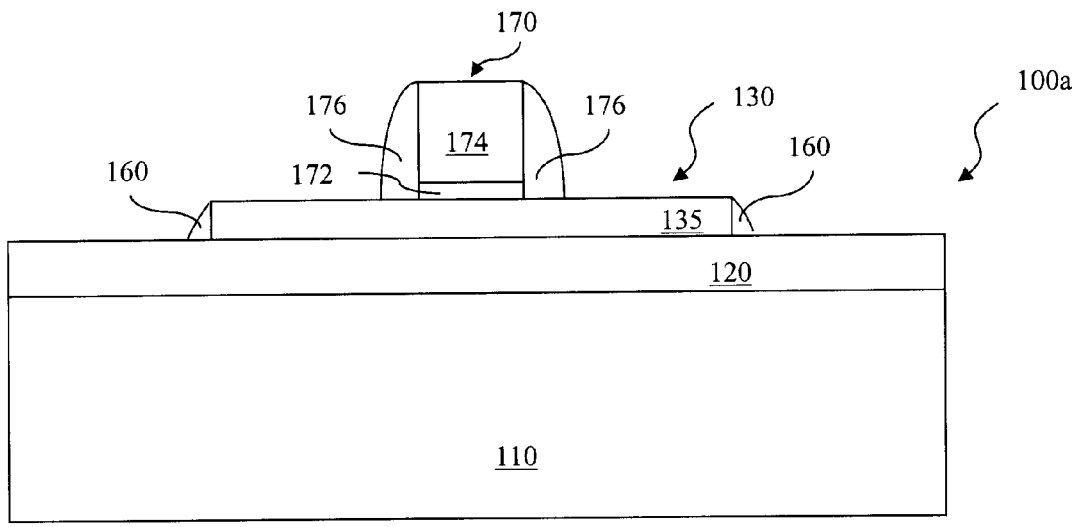
Figure 7B:
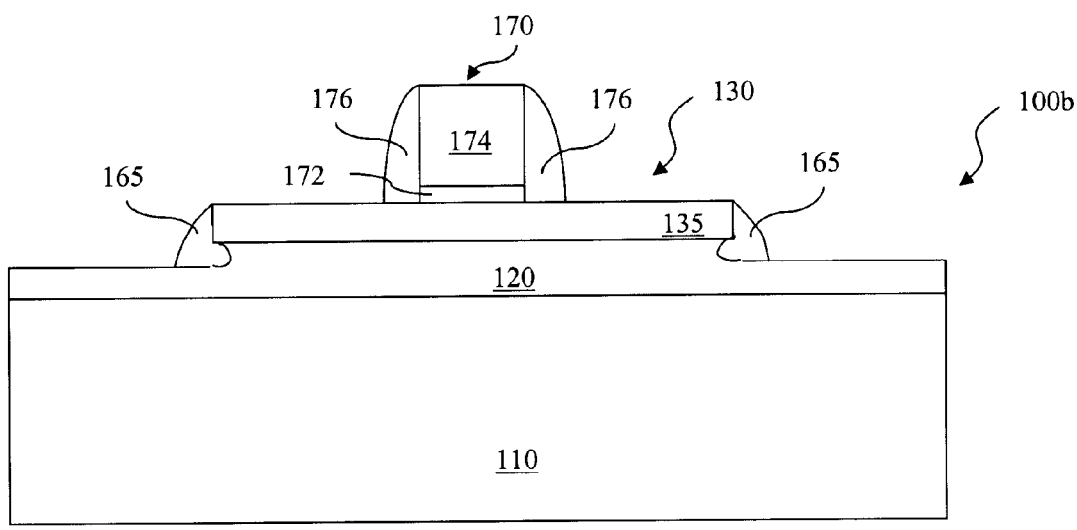

The method 200 may proceed to step 218 at which gate spacers 176 are formed on both sides of the gate stack 170 as shown in FIGS. 7a and 7b, using a process similar to the process of forming the isolation spacers. The gate spacers 176 may include a dielectric material such as silicon nitride (SiN), silicon oxynitride (SiON), and/or silicon oxide ($SiO_2$), for example. The gate spacers 176 may be formed by depositing the dielectric material by CVD, CVD, ALD, PVD, and/or other processing methods, and then anisotropically etching back.

Figure 8:
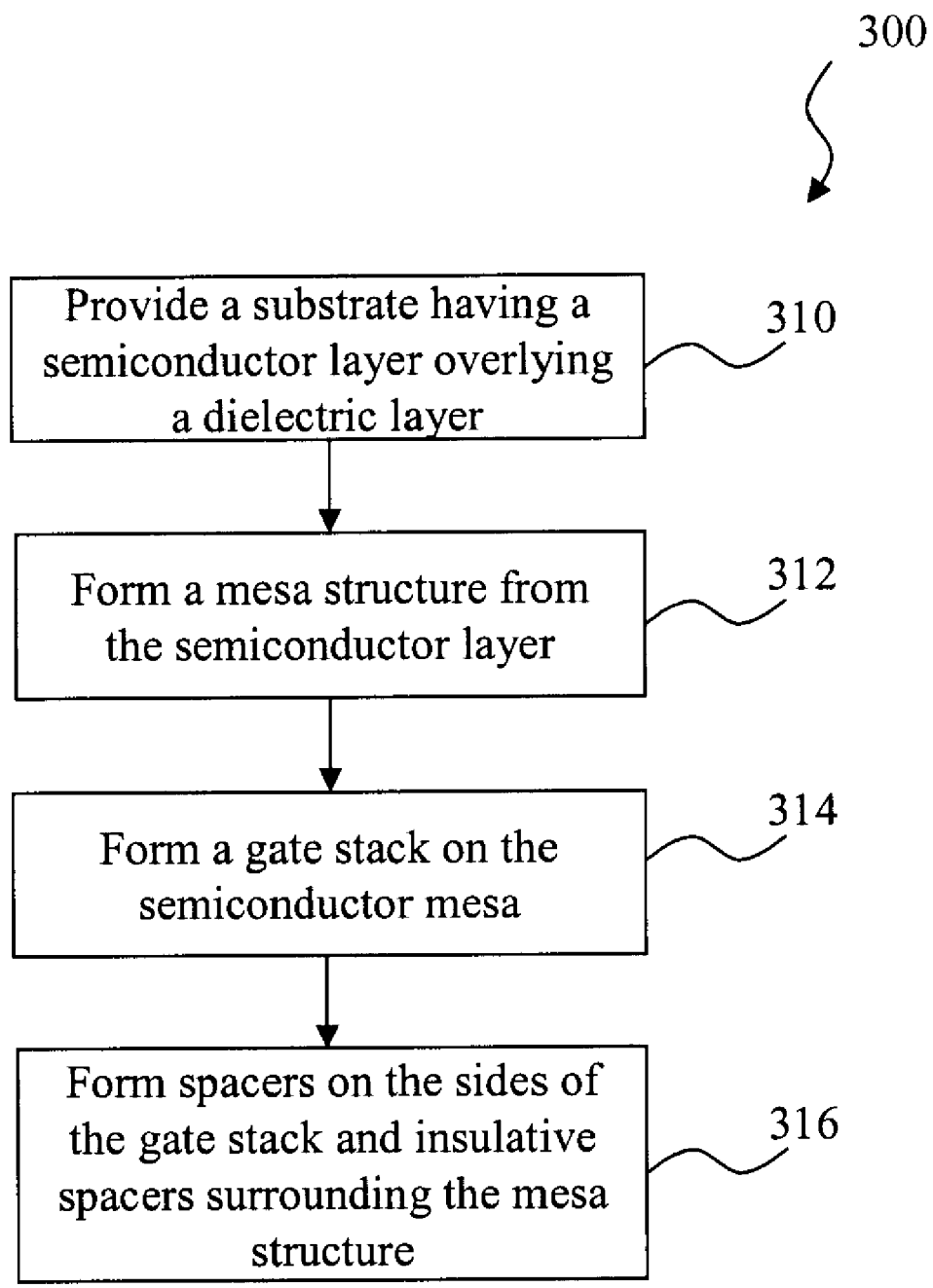
FIG. 8 is a simplified flowchart of another embodiment of a method to form a thin SOI device.

Referring to FIG. 8, illustrated is a simplified flowchart of another embodiment of a method to form a SOI device. The method 300 begins at step 310 by providing a substrate having a semiconductor layer and being interposed by a dielectric layer. At next step 312, a semiconductor mesa feature is formed. Both step 310 and 312 are substantially similar to steps 210 and 212 in the method 200 with reference to FIGS. 2, 3, and 4. Similarly, the undercut 125 may be formed in the dielectric layer 120 as shown in FIG. 4b. In another example as shown in FIG. 4a, no undercut is formed.

Figure 9A:
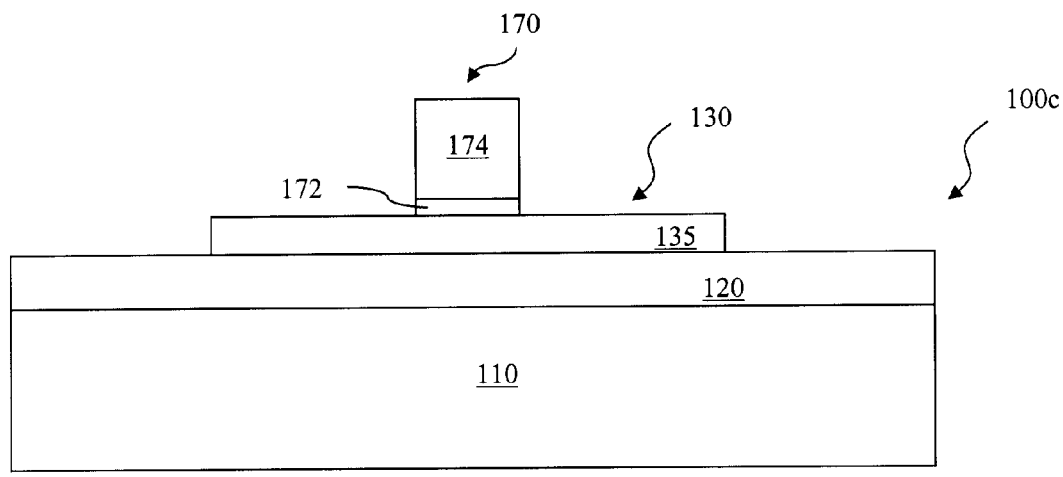
Figure 9B:
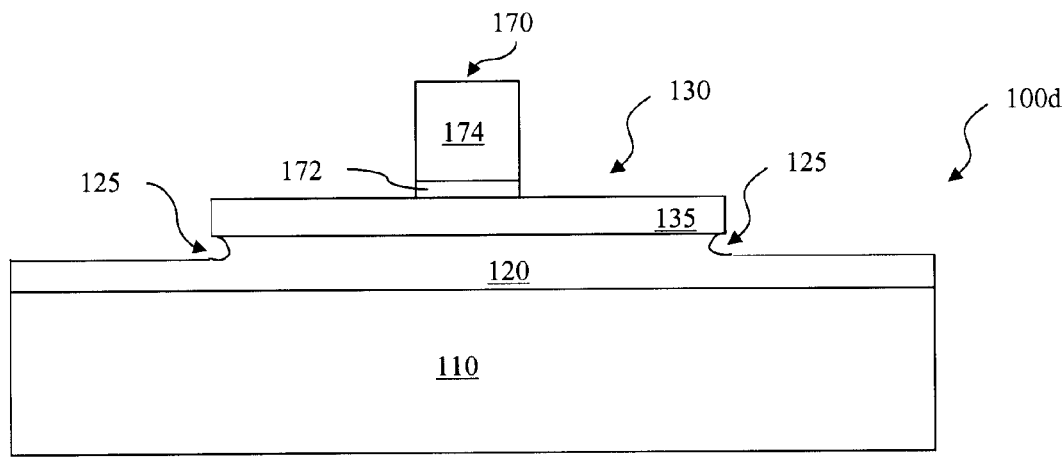

Referring to FIGS. 9a and 9b, the method 300 proceeds to step 314 at which a gate stack such as the gate stack 170 may be formed on the substrate 110. The step 314 may be substantially similar to the step 216 in the method 200 in terms of material, process, and structure. For example, the gate stack 170 may be formed by forming a dielectric layer, forming a conductive layer, and then patterning the both layers using photolithography and etching processing to partially remove both the dielectric layer and conductive layer. Both the gate dielectric 172 and gate electrode 174 are formed thereby.

Figure 10A:
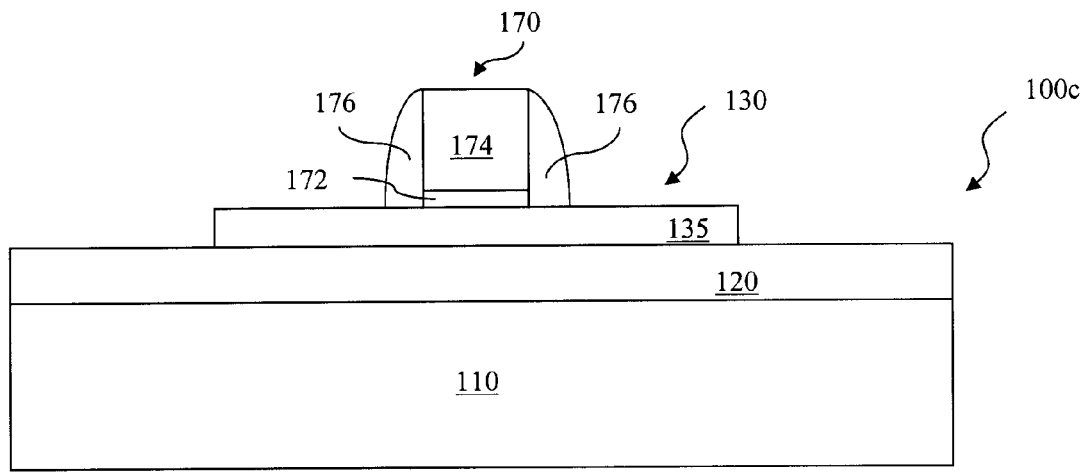
Figure 10B:
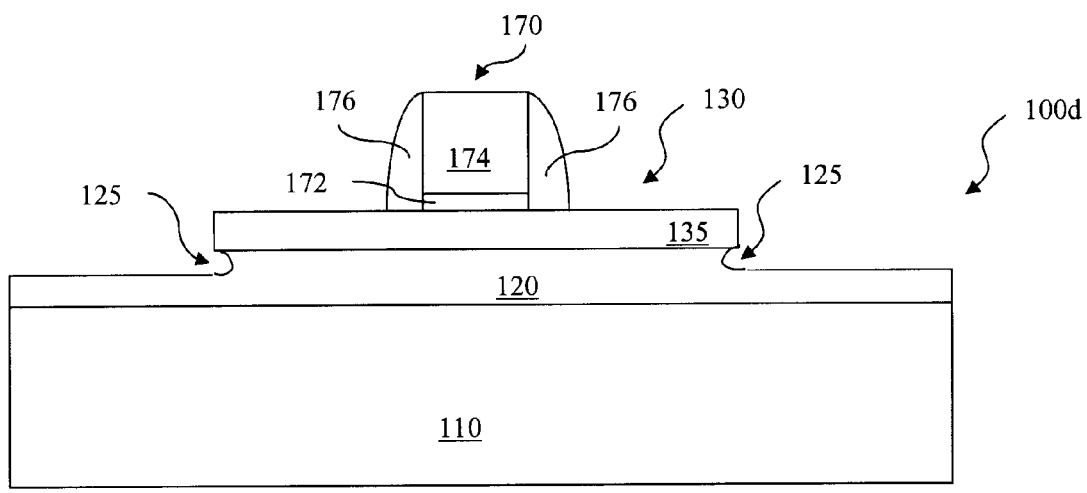

Referring to FIGS. 10a and 10b, the method 300 proceeds to step 316 at which gate spacers 176 are formed on both sides of the gate stack 170. The step 316 may be substantially similar to the step 218 of the method 200 in terms of material, process, and structure. For example, the silicon oxide and/or silicon nitride may be formed and then anisotropically etched back to form the spacers 176.

Figure 11A:
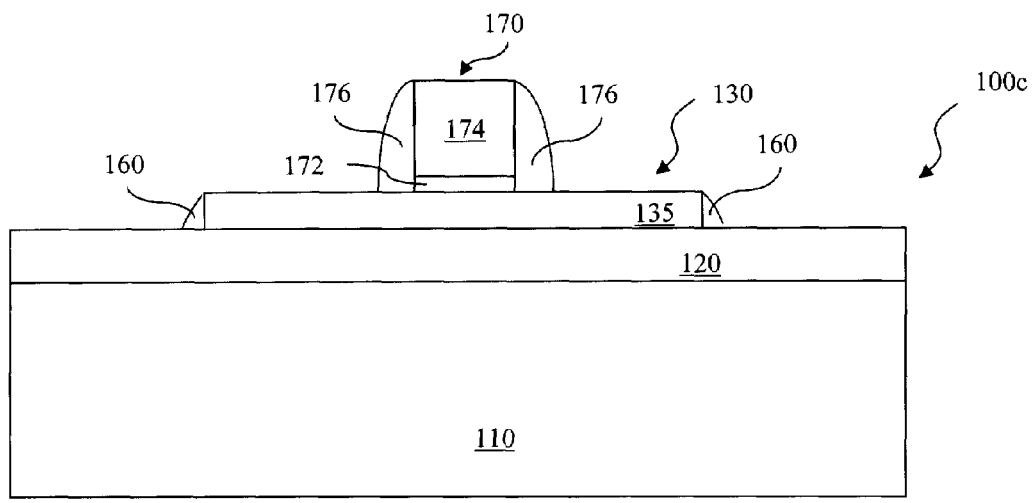
Figure 11B:
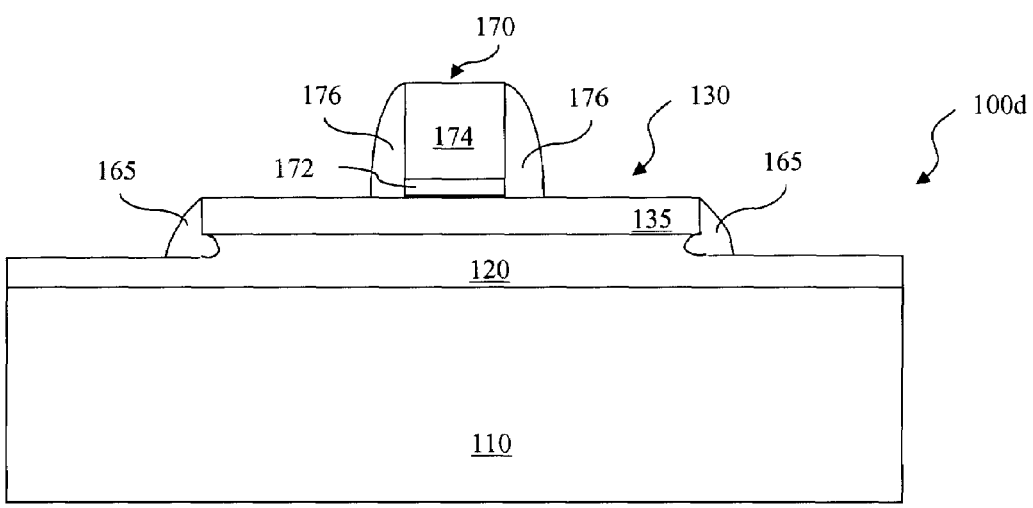

Referring to FIG. 11a (11b), isolation spacers 160 (165) may be formed during the same step 316 to form the gate spacers 176, may be formed at a next step, or may be partially formed at step 316 and partially formed at the next step. For example, silicon oxide and silicon nitride layer are formed and anisotropically etched back to form gate spacers 176. This processing flow may also form the isolation spacer 160 (165) at the edges of the semiconductor mesa 130 and fill the undercut regions 125 of dielectric layer 120 at the edges of the mesa 130. Then at the next step, another dielectric layer including silicon oxide and/or silicon nitride may be formed and etched back to add an additional layer to the isolation spacers 160 (165).

Overall, the semiconductor device 100 may also include metal silicide formed on the gate electrode and source/drain regions by a method such as metal deposition, annealing, and removal of un-reacted metal. The semiconductor device 100 may also include doped channel, source, and drain formed in the semiconductor mesa 130 by various doping processes including ion implantation. For example, doping for source and drain may be implemented by ion implant after the gate stack is formed and/or after the gate spacers are formed each with different doping dose and ion energy. It is understood that the semiconductor mesa 130 may have a P-type doped region, an N-type doped region, and/or a combination thereof. N-type dopants are employed to form a channel for a P-type metal-oxide-semiconductor field effect transistor (PMOSFET or PMOS) or source/drain regions for an N-type metal-oxide-semiconductor field effect transistor (NMOSFET or NMOS) and may include phosphorus, arsenic, and/or other materials. P-type dopants are employed to form a channel for an NMOS or source/drain regions for a PMOS and may include boron, boron fluoride, indium, and/or other materials. Subsequent diffusion, annealing, and/or electrical activation processes may also be employed after the impurity is implanted.

A semiconductor thin SOI device such as the semiconductor device 100 having isolation spacers may be extended and incorporated to other integrated circuit in which a semiconductor mesa structure is used. The semiconductor device 100 may be incorporated into an integrated circuit including an electrically programmable read only memory (EPROM) array, an electrically erasable programmable read only memory (EEPROM) array, a static random access memory (SRAM) array, a dynamic random access memory (DRAM) array, a single electron transistor (SET), a high power transistor such as a lateral diffused MOS (LDMOS) and vertical diffused MOS (VDMOS), and/or other microelectronic devices (hereafter collectively referred to as microelectronic devices).

Figure 12A:
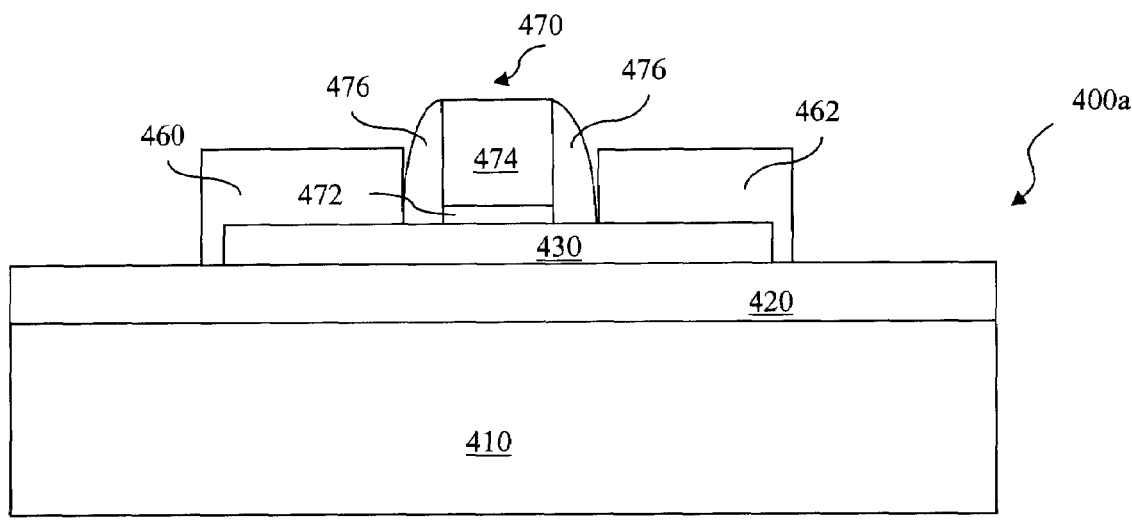
FIGS. 12a and 12b are sectional views of exemplary embodiments of a thin SOI device.
Figure 12B:
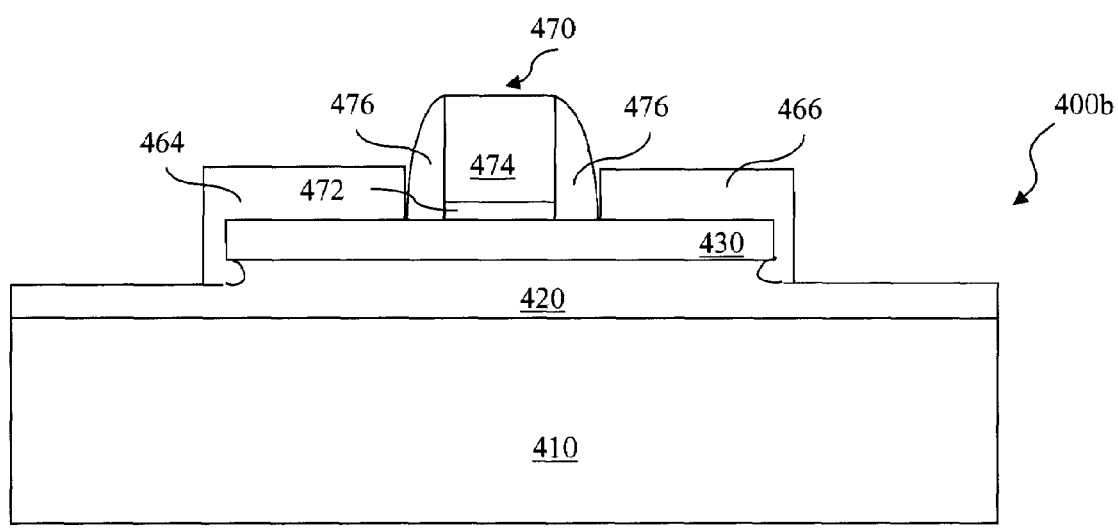
Figure 13:
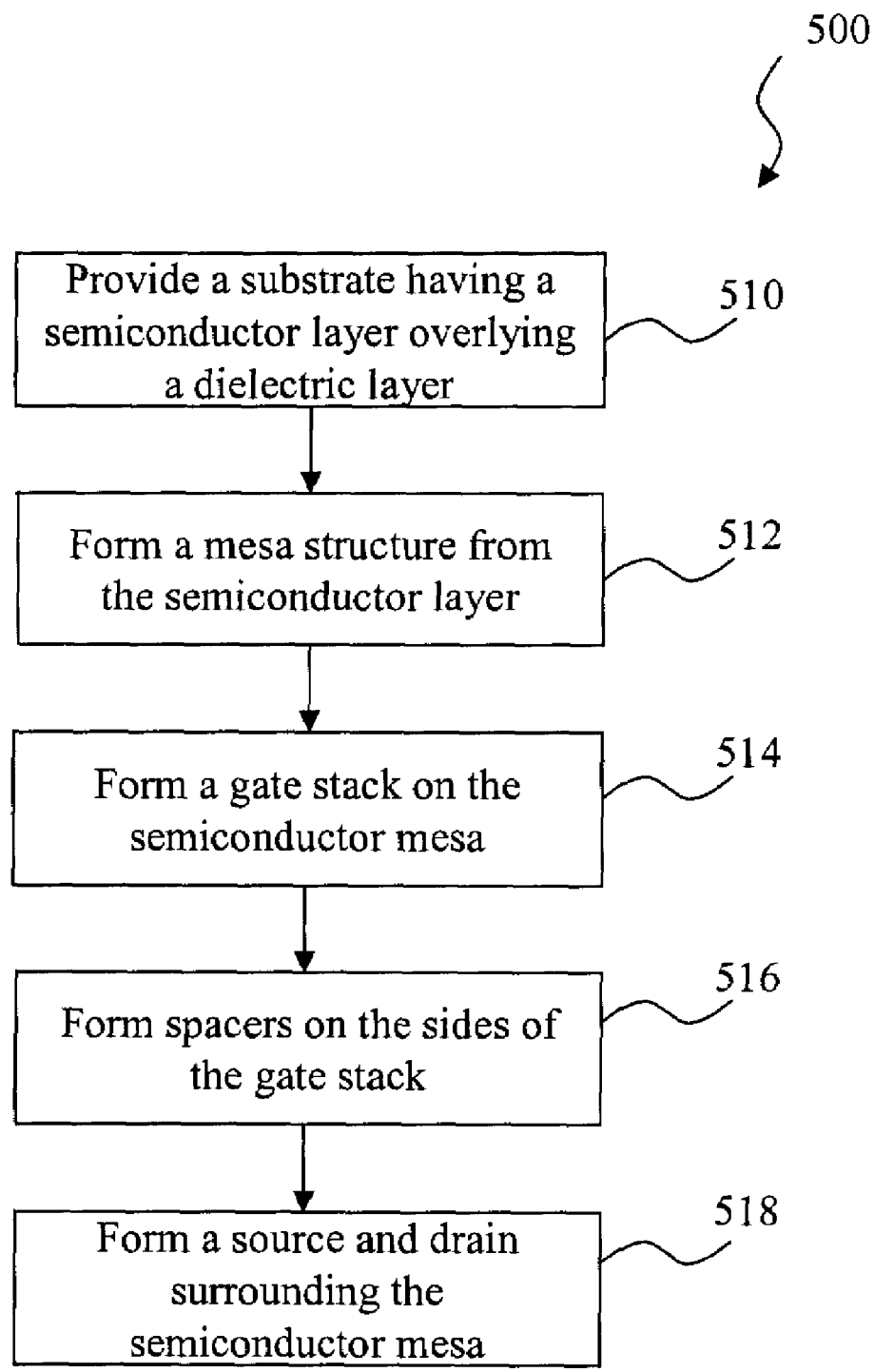
FIG. 13 is a simplified flowchart of a method to form an embodiment of thin SOI device

Referring to FIGS. 12a and 12b, illustrated are sectional views of additional embodiments of a SOI semiconductor device. The SOI device is described below and an exemplary method to form the same also is provided with additional reference to a simplified flowchart 500 illustrated in FIG. 13. The semiconductor device 400a (or 400b) includes a substrate 410, a dielectric layer 420 disposed over the substrate 410, and a semiconductor mesa (or island) 430 disposed over the dielectric layer 420, similar to the substrate 110, the dielectric layer 120, and the semiconductor mesa 130 of the semiconductor device 100a in FIG. 7a (100b in FIG. 7b) in terms of material, structure, and processing. The semiconductor mesa 430 may function as a channel for the semiconductor device 400a (or 400b) with proper doping profile and concentration but may not comprise a source and a drain, different from the semiconductor mesa 130 in which the source and the drain are included. The dielectric layer 420 may further include an undercut formed at edges of the semiconductor mesa 430 as shown in FIG. 12b.

The semiconductor substrate 410, the dielectric layer 420, and a semiconductor layer may be formed at step 510 of the method 500. The semiconductor layer is patterned to form the semiconductor mesa 430 at step 512. The step 510 and 512 are substantially similar to steps 210 and 212 of the method 200 or steps 310 and 312 of the method 300. In one example, undercut regions may be formed in the dielectric layer 420 as shown in FIG. 12b. In another example as shown in FIG. 12a, no undercut is formed.

The semiconductor device 400a (or 400b) may include a gate stack 470 comprising a gate dielectric 472 and a gate electrode 474, substantially similar to the gate stack 170. The gate stack 470 is formed on the semiconductor mesa 430 at step 514, substantially similar to the step 314 of the method 300 in terms of material and process. For example, the gate stack 470 may be formed by forming a dielectric layer, forming a conductive layer, and then patterning the both layers by photolithography and etching processing to partially remove the dielectric layer and conductive layer.

The device 400 may further include gate spacers 476, substantially similar to the gate spacers 176 of the semiconductor device 100a (or 100b). The spacers 476 may be formed on both sides of the gate stack 170 at step 516, substantially similar to the step 316 of the method 300 in terms of material and process. For example, the silicon oxide and/or silicon nitride may be formed and then anisotropically etched back to form the spacers 476.

Further, the semiconductor device 400 may include a source region 460 in FIG. 12a (or 464 in FIG. 12b) and a drain region 462 in FIG. 12a (or 466 in FIG. 12b). The source and drain are surrounding the semiconductor mesa 430, and may be extended to above and over the semiconductor mesa 430 to partially or substantially cover the surface thereof, such that each of the source and drain is close to or in contact with the gate spacers. The source and drain protect the edges of the semiconductor mesa 430. In semiconductor device 400b, the source and drain may be extended to substantially fill in the undercut regions at the edges of the semiconductor mesa 430. The source and drain may comprise silicon, silicon germanium, silicon carbide, or other semiconductor material. The source/drain may have semiconductor materials different from those of the semiconductor mesa. For example, the semiconductor mesa 430 may comprise silicon while the source/drain may comprise silicon germanium. Alternatively, the semiconductor mesa 430 may comprise silicon germanium while the source/drain may comprise silicon. In another embodiment, one of NMOS and PMOS may have source/drain comprising silicon germanium and the another may have source/drain comprising silicon carbide, while the semiconductor mesa may comprise silicon. Alternatively, the semiconductor mesa for one of NMOS and PMOS may comprise silicon germanium, and the semiconductor mesa for the another may comprise silicon carbide while the source/drain for both NMOS and PMOS may comprise silicon. In another embodiment, the semiconductor mesa and the source/drain regions may comprise semiconductor material different from the semiconductor substrate 410 or bottom portion of that to have a strained structure for device performance enhancement. The source and drain may be in a single crystal structure formed by processing such as selective epi growth (SEG), and other suitable process. A semiconductor thin SOI device 400 may be extended and incorporated to other integrated circuit in which a mesa structure is implemented.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A semiconductor device, comprising:
    a semiconductor mesa;
    a dielectric centered under and adjacent to the semiconductor mesa, including undercut regions at outer portions of the dielectric such that a width of the dielectric is less than a width of the semiconductor mesa;
    a gate stack formed overlying the semiconductor mesa, the gate stack including sidewall spacer; and
    a source and a drain on either side of the gate stack, wherein portions of the source and drain further extend into and fill the undercut regions of the dielectric.

2. The semiconductor device of claim 1 wherein the source and drain are positioned to create a channel in the semiconductor mesa.

3. The semiconductor device of claim 1 wherein portions of the source and drain are positioned on top of the semiconductor mesa.

4. The semiconductor device of claim 1, further comprising:
    a semiconductor substrate directly under the dielectric.

5. The semiconductor device of claim 1, wherein the dielectric is a part of a multi-level isolation layer.

6. The semiconductor device of claim 1, wherein the dielectric comprises silicon oxide.

7. A semiconductor device, comprising:
    a semiconductor mesa overlying a dielectric layer;
    a gate dielectric formed overlying the semiconductor mesa;

a gate electrode formed on the gate dielectric; and a source and a drain formed surrounding the semiconductor mesa wherein the source and drain are extended to substantially fill in an undercut formed in the dielectric layer, wherein the dielectric layer is in abutment with the semiconductor mesa and wherein the undercut laterally extends beneath the semiconductor mesa.

8. The semiconductor device of claim 7, wherein the source and drain are extended to cover the semiconductor mesa.

9. The semiconductor device of claim 7, wherein the source and drain comprise a material selected from the group consisting of silicon, germanium, and carbon.

10. The semiconductor device of claim 7, wherein the semiconductor mesa comprises a material selected from the group consisting of silicon, germanium, and carbon.

11. The semiconductor device of claim 7, wherein the semiconductor mesa has a thickness ranging from about 5 nm to about 200 nm.

12. The semiconductor device of claim 7, wherein the gate dielectric layer comprises a material selected from the group consisting of silicon oxide and high-k material.

13. The semiconductor device of claim 7, wherein the gate electrode comprises a material selected from the group consisting of polycrystalline silicon, metal, and metal silicide.

* * * * *